United States Patent [19]
Williams

[11] Patent Number: 5,152,448
[45] Date of Patent: Oct. 6, 1992

[54] INTEGRATED CIRCUIT DISASSEMBLY APPARATUS

[76] Inventor: Clinton H. Williams, Golden Gates Estates #2, P.O. Box 2055, GT Nassau, The Bahamas

[21] Appl. No.: 783,524

[22] Filed: Oct. 28, 1991

[51] Int. Cl.$^5$ .................. B23K 3/02; B23K 1/018
[52] U.S. Cl. ........................ 228/51; 228/55; 228/19; 228/264; 219/231
[58] Field of Search ............ 228/51, 19, 55, 191, 228/201, 264; 219/229, 231; 15/176.2, 179

[56] References Cited

U.S. PATENT DOCUMENTS

| | | | |
|---|---|---|---|
| 3,050,612 | 8/1962 | Eversole | 228/51 |
| 3,084,649 | 4/1963 | Parstorfer | 228/19 |
| 3,813,023 | 5/1974 | Auray et al. | 228/19 |
| 3,923,002 | 12/1975 | Vanyi | 228/36 |
| 4,720,036 | 1/1988 | Lison et al. | 228/205 |
| 4,769,083 | 9/1988 | Tiritilli | 228/19 |

Primary Examiner—Richard K. Seidel
Assistant Examiner—Jeffrey T. Knapp
Attorney, Agent, or Firm—Leon Gilden

[57] ABSTRACT

To effect disassembly of components relative to an integrated circuit board, the circuit board and its typical construction, including the soldering of the various components projected through the circuit board, is effected by an anvil, including a plurality of anvil bores, wherein the anvil is heated and each anvil bore is accordingly heated effecting the elimination of the associated soldering joints of each projecting tip of an associated electrical component directed through the circuit board. The apparatus further includes a metallic brush member arranged for securement to an associated heating member or gun to effect the cleaning and removal of solder residue remaining on the circuit board. Further, various anvil sizes are provided to accommodate various circuit board patterns and may be provided in a kit form in a single unitary container.

4 Claims, 4 Drawing Sheets

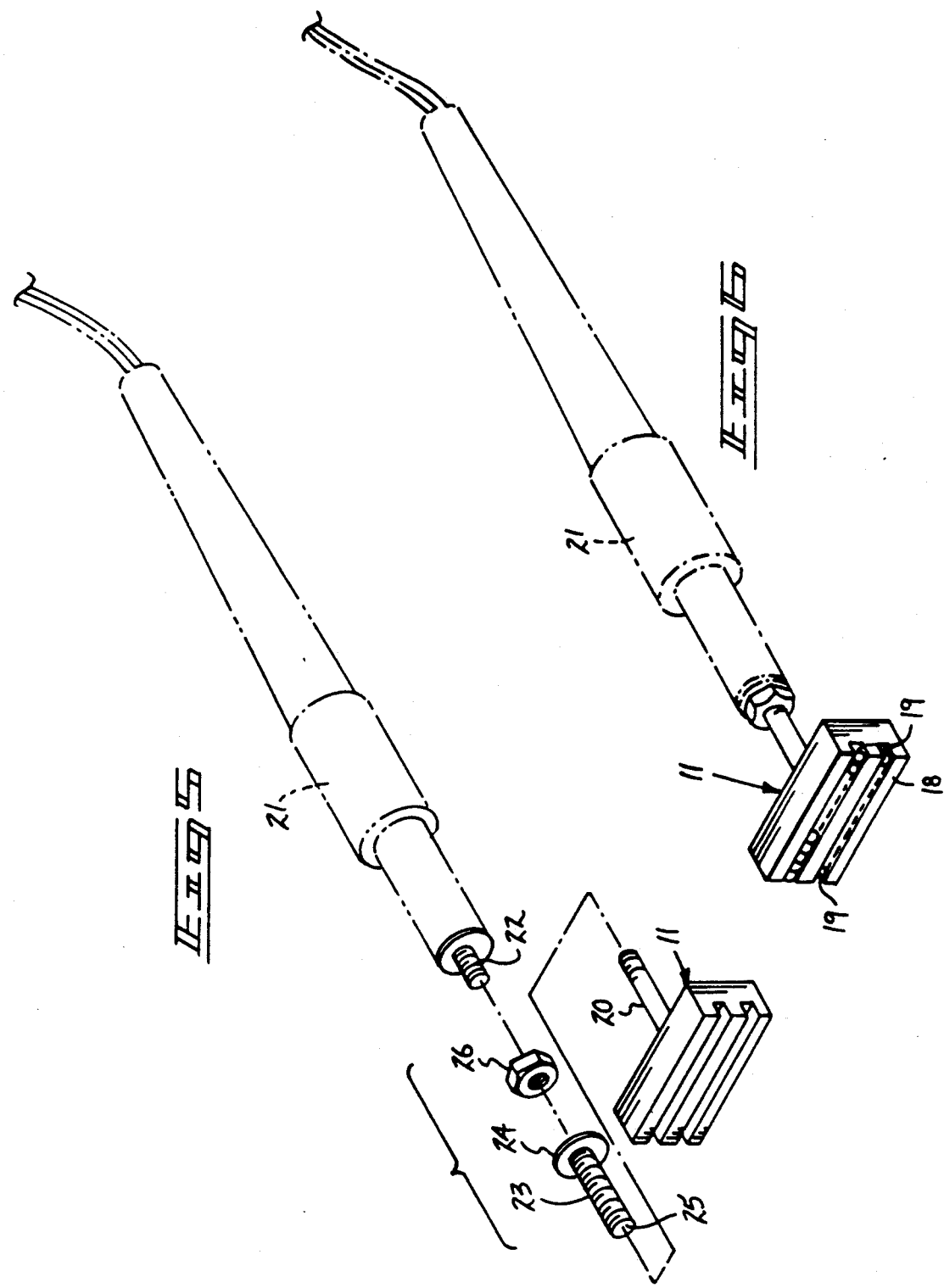

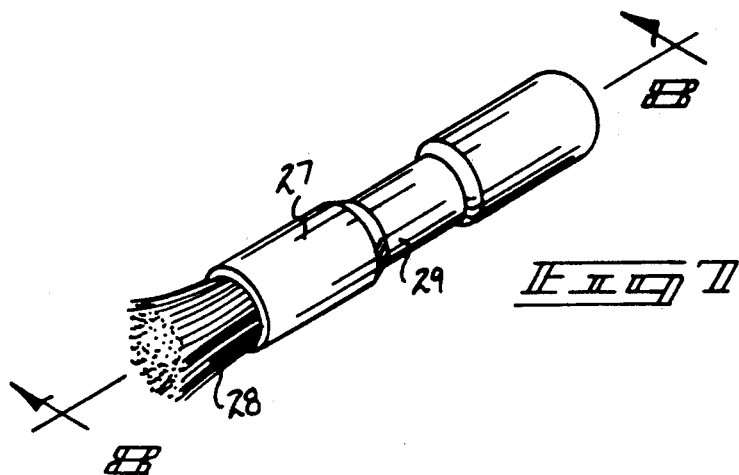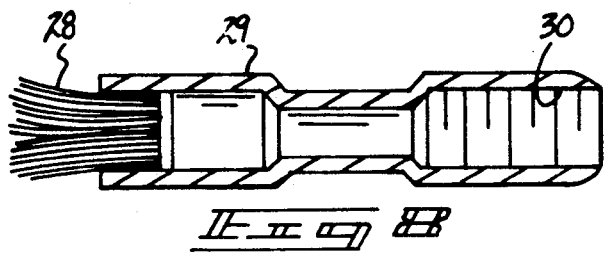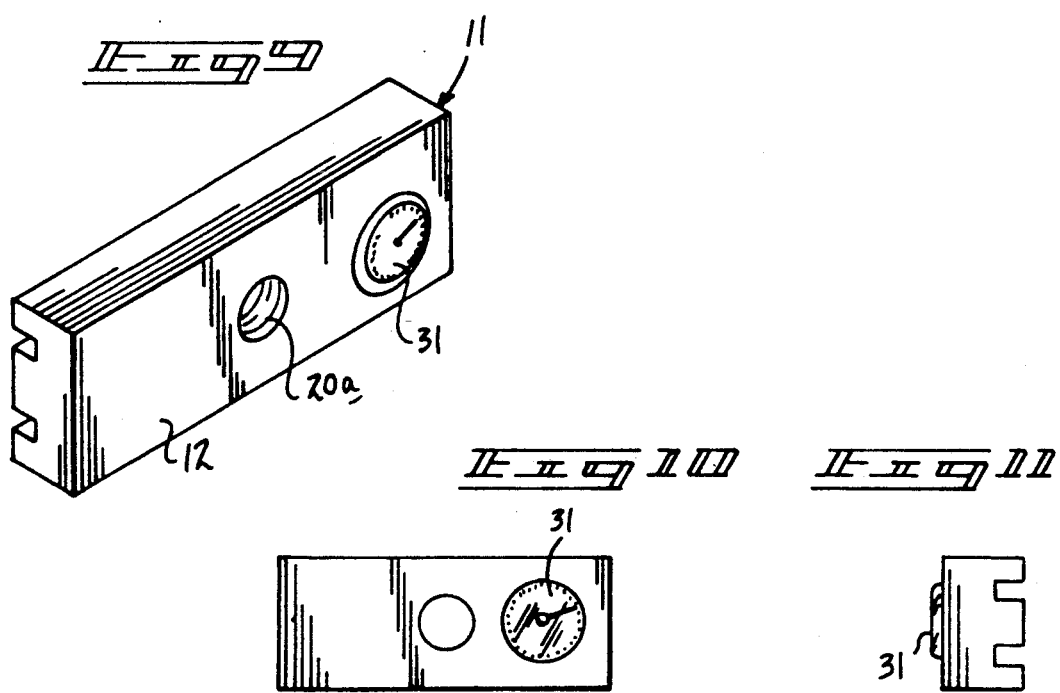

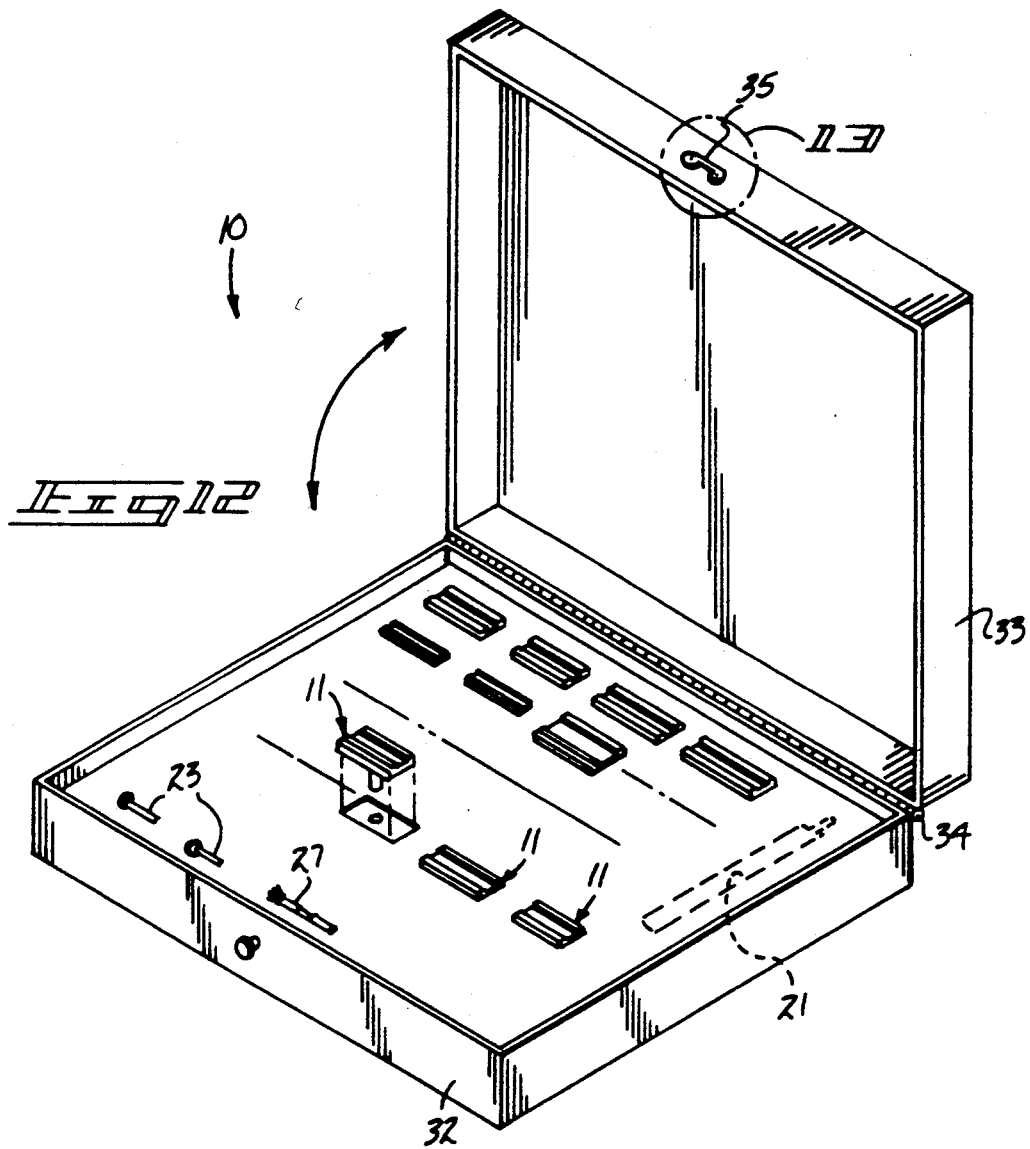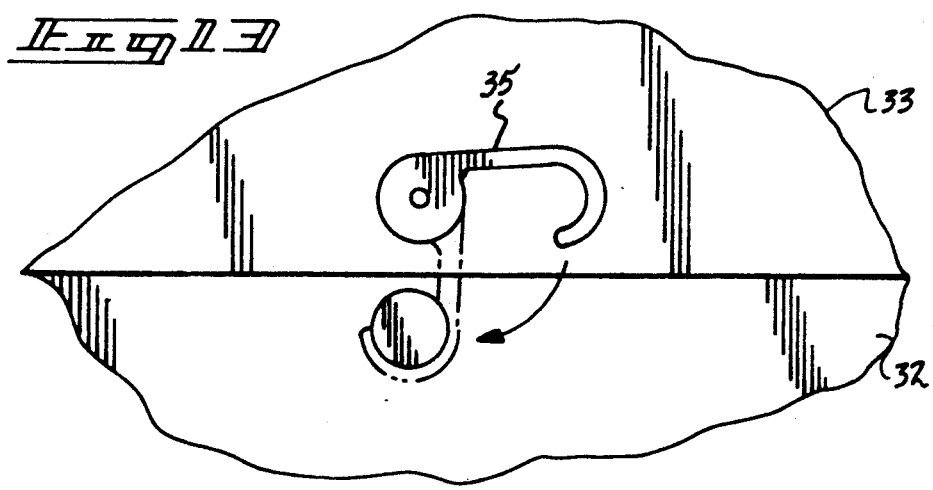

INTEGRATED CIRCUIT DISASSEMBLY APPARATUS

BACKGROUND OF THE INVENTION

1. Field of the Invention

The field of invention relate to circuit board apparatus, and more particularly pertains to a new and improved integrated circuit disassembly apparatus wherein the same is arranged to effect the melting of circuit board junctions and accordingly permit the disassembly of the components relative to the circuit board structure.

2. Description of the Prior Art

To retrieve, repair, and permit maintenance of various circuit board components, prior art structure has been resolved to the time arduous procedure of dissolving solder relative to each individual joint. Prior art structure related to circuit board assembly and the like may be found in U.S. Pat. No. 3,414,960 to Michael setting forth a metallic plate utilizing spacers arranged for mounting of various electronic modules thereon.

U.S. Pat. No. 4,799,617 to Friedman sets forth a convection heat attachment and instrument to heat and melt various solder contacts.

U.S. Pat. No. 4,412,641 to Fuchs, et al. sets forth a desoldering apparatus wherein an elaborate heat table is provided and suction applied from below to remove residual solder.

As such, it may be appreciated that there continues to be a need for a new and improved integrated circuit disassembly apparatus as set forth by the instant invention which addresses both the problems of ease of use as well as effectiveness in construction and in this respect, the present invention substantially fulfills this need.

SUMMARY OF THE INVENTION

In view of the foregoing disadvantages inherent in the known types of desoldering apparatus now present in the prior art, the present invention provides an integrated circuit disassembly apparatus wherein the same is arranged for the selective mounting of various anvil members relative to a heating gun to permit positioning of the anvil relative to integrated circuit tip connectors to effect their desoldering relative to the circuit board. As such, the general purpose of the present invention, which will be described subsequently in greater detail, is to provide a new and improved integrated circuit disassembly apparatus which has all the advantages of the prior art desoldering apparatus and none of the disadvantages.

To effect disassembly of components relative to an integrated circuit board, the circuit board and its typical construction, including the soldering of the various components projected through the circuit board, is effected by an anvil, including a plurality of anvil bores, wherein the anvil is heated and each anvil bore is accordingly heated effecting the elimination of the associated soldering joints of each projection tip of an associated electrical component directed through the circuit board. The apparatus further includes a metallic brush member arranged for securement to an associated heating member or gun to effect the cleaning and removal of solder residue remaining on the circuit board. Further, various anvil sizes are provided to accommodate various circuit board patterns and may be provided in a kit form in a single unitary container.

My invention resides not in any one of these features per se. but rather in the particular combination of all of them herein disclosed and claimed and it is distinguished from the prior art in this particular combination of all of its structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved integrated circuit disassembly apparatus which has all the advantages of the prior art desoldering apparatus and none of the disadvantages.

It is another object of the present invention to provide a new and improved integrated circuit disassembly apparatus which may be easily and efficiently manufactured and marketed.

It is a further object of the present invention to provide a new and improved integrated circuit disassembly apparatus which is of a durable and reliable construction.

An even further object of the present invention is to provide a new and improved integrated circuit disassembly apparatus which is susceptible of a low cost of manufacture with regard to both materials and labor, and which accordingly is then susceptible of low prices of sale to the consuming public, thereby making such integrated circuit disassembly apparatus economically available to the buying public.

Still yet another object of the present invention is to provide a new and improved integrated circuit disassembly apparatus which provides in the apparatuses and methods of the prior art some of the advantages thereof, while simultaneously overcoming some of the disadvantages normally associated therewith.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 5 is an isometric illustration of the anvil structure mounted to an associated heating gun.

FIG. 6 is an isometric illustration of the heating gun in an assembled configuration.

FIG. 7 is an isometric illustration of a brush member utilized by the kit structure of the invention.

FIG. 8 is an orthographic view, taken along the lines 8—8 of FIG. 7 in the direction indicated by the arrows.

FIG. 9 is an isometric illustration of a modified anvil structure utilizing a temperature gauge member mounted to a rear wall of the anvil structure.

FIG. 10 is an orthographic rear view of the anvil structure set forth in FIG. 9.

FIG. 11 is an orthographic end view of the anvil structure as set forth in FIG. 9.

FIG. 12 is an isometric illustration of the kit apparatus of the invention.

FIG. 13 is an orthographic view of section 13 as set forth in FIG. 12.

DESCRIPTION OF THE PREFERRED EMBODIMENT

Figure 1:
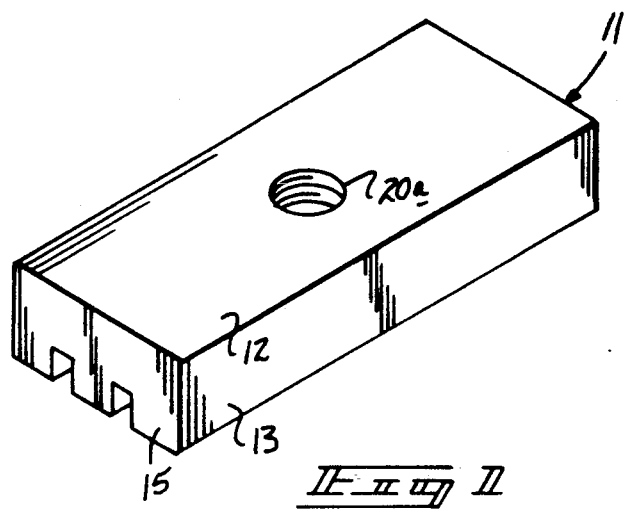
FIG. 1 is an isometric illustration of the anvil structure utilized by the invention.
Figure 2:
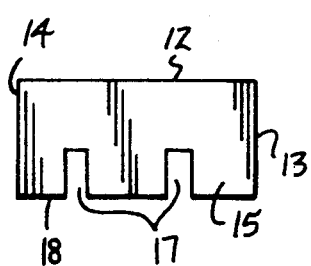
FIG. 2 is an orthographic end view of the anvil as set forth in FIG. 1.
Figure 3:
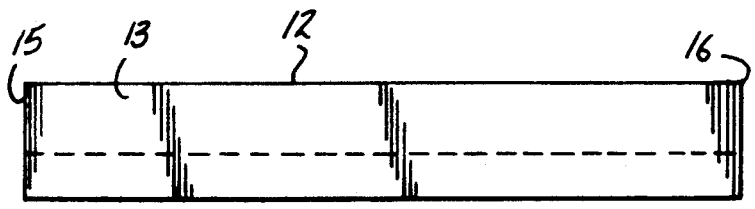
FIG. 3 is an orthographic side view of the anvil structure.

With reference now to the drawings, and in particular to FIGS. 1 to 13 thereof, a new and improved integrated circuit disassembly apparatus embodying the principles and concepts of the present invention and generally designated by the reference numeral 10 will be described.

Figure 4:
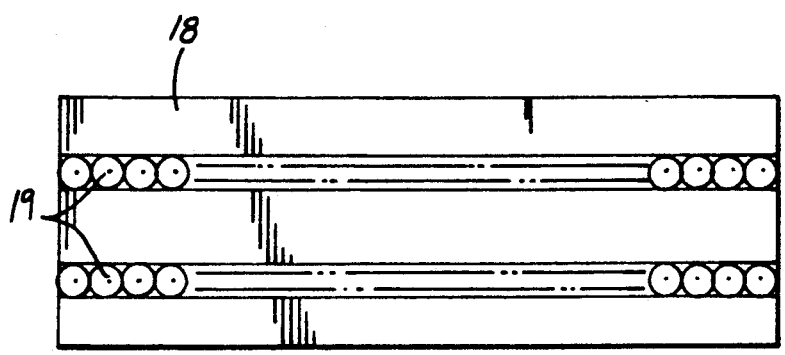
FIG. 4 is an orthographic top view of the anvil structure.

More specifically, the integrated circuit disassembly apparatus 10 of the instant invention essentially comprises a unitary heat transmissive anvil member 11 formed with a bottom wall 12 spaced from a top wall 18, with a first side wall 13 spaced from a second side wall 14, and a first end wall 15 spaced from a second end wall 16. Parallel grooves 17 are directed coextensively into the top wall 18 and project through the end walls 15 and 16 and are orthogonally oriented relative to the associated end walls, as illustrated in the FIGS. 1 and 4 for example. A row of cylindrical pin receiving tubes 19 are positioned within the grooves and are coextensive with the grooves. The tubes 19 are defined by an axial height substantially equal to a predetermined depth defined by each of the grooves. The tubes 19 are as illustrated coextensively positioned within each of the grooves in contiguous relationship relative to one another. As illustrated in FIG. 4, an anvil shank 20 is integrally mounted to, or alternatively selectively secured in a threaded inter-relationship relative to a shank bore 20a orthogonally mounted medially within the bottom wall 12 to orient the shank 20 in an orthogonal relationship relative to the bottom wall 12. A heating gun member 21 is provided that includes a heating boss 22 arranged to transmit generated heat from the heating gun through the heating boss 22 into the anvil member 11. Adapter sleeve 23 includes a central bore 25 receiving the shank 20 with the sleeve 23 including a sleeve flange 24 arranged for abutment against the heating gun member 21. A fastener 26 receives the boss 22 and the shank 20 for assembly of the components together.

The FIGS. 7 and 8 illustrate the use of a metallic brush member 27, including metallic bristles 28 and including a brush body 29 formed with an internally threaded central bore 30 securable to the heating gun boss 22 upon removal of the anvil member 11 therefrom to permit heating of the brush member 27 to heat the associated metallic bristles 28 and thereby permit the removal of various soldering debris remaining on a conventional circuit board (not shown) subsequent to a desoldering procedure. The FIG. 9 illustrates the use of the anvil member 11 formed with an integrally mounted temperature gauge 31 mounted to the bottom wall 12 to permit visual indication of attaining of appropriate desoldering temperature by the anvil member 11 and its mounting to the heating gun member 21.

The FIGS. 12 and 13 illustrate the use of a housing container 32 formed with a lid 33 hingedly mounted to the container 32 by a hinge 34, with a latch 35 positioned to the container lid opposed to the hinge permitting selective securement of the lid relative to the container. The container includes a plurality of anvil members 11 of various sizes to accommodate desoldering of various pin connections of a multitude of circuit boards permitting its adaptability in use. Further, the container includes the associated adapter sleeve structure 23, brush member, and may further include spacing for mounting the heating gun member 21 therewithin. It should be further noted that the various anvils 11 contained within the kit structure are defined by various lengths and widths as measured between the end walls and side walls to accommodate various integrated circuit structure.

As to the manner of usage and operation of the instant invention, the same should be apparent from the above disclosure, and accordingly no further discussion relative to the manner of usage and operation of the instant invention shall be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. An integrated circuit disassembly kit apparatus, comprising, an anvil member, the anvil member formed of a unitary heat transmissive material, including a bottom wall spaced from a top wall, a first side wall spaced from a second side wall, and a first end wall spaced from a second end wall, and an anvil shank orthogonally and medially mounted relative to the bottom wall extending exteriorly thereof, and the top wall including a plurality of spaced parallel grooves coextensive with the top wall extending and projecting through the first end wall and the second end wall orthogonally oriented relative to the first end wall and the second wall, and a heating gun member, the shank selectively securable to the heating gun member to direct heating of the anvil member for desoldering of an integrated circuit joint connection, and each of the grooves is defined by a predetermined groove height, and each of the grooves include a plurality of pin receiving tubes mounted coextensively of each of the grooves and in contiguous relationship to one another, and each of the tubes are defined by a tube height equal to the predetermined groove height, and the heating gun member includes a heating gun member boss extending forwardly of the heating gun member, the boss including an adapter sleeve, the adapter sleeve including an adapter sleeve flange arranged for abutment with the heating gun member, and wherein the adapter sleeve is defined by a central bore, the central bore is arranged for reception of the anvil shank therethrough, and a fastener arranged for securement of the anvil shank to the heating gun boss.

2. A kit as set forth in claim 1 wherein the kit further includes a metallic brush selectively securable to the heating gun boss, wherein the metallic brush includes a metallic brush body formed with a lower distal end, including an internally threaded central bore selectively securable to the heating gun boss, and a forward distal end fixedly mounting a matrix of metallic bristle brush members thereto to permit transmission of heat to the bristle brush members and removal of solder debris relative to an integrated circuit board member.

3. A kit as set forth in claim 2 wherein the bottom wall of the anvil member includes a temperature sensitive gauge mounted integrally thereto for visual indication of heating of the anvil member.

4. A kit as set forth in claim 3 including a housing container, the housing container including a plurality of anvil members, each of the anvil members formed of a varying predetermined length, and further including the adapter sleeve, the metallic brush, and the heating gun therewithin, the container including a lid hingedly mounted to the container, and further including a latch to permit selective securement of the lid to the container.

* * * * *